(12) United States Patent
Prisecaru et al.

(10) Patent No.: US 10,353,027 B2
(45) Date of Patent: Jul. 16, 2019

(54) EPR MICROWAVE CAVITY FOR SMALL MAGNET AIRGAPS

(71) Applicant: Bruker BioSpin GmbH, Rheinstetten (DE)

(72) Inventors: Ion Prisecaru, Karlsruhe (DE); Peter Hoefer, Ettlingen (DE)

(73) Assignee: Bruker BioSpin GmbH, Rheinstetten (DE)

( * ) Notice: Subject to any disclaimer, the term of this patent is extended or adjusted under 35 U.S.C. 154(b) by 292 days.

(21) Appl. No.: 15/063,536

(22) Filed: Mar. 8, 2016

(65) Prior Publication Data

US 2016/0274200 A1  Sep. 22, 2016

(30) Foreign Application Priority Data

Mar. 18, 2015  (EP) .................................. 15 159 643

(51) Int. Cl.
*H01P 7/10* (2006.01)
*G01R 33/343* (2006.01)
(Continued)

(52) U.S. Cl.
CPC ......... *G01R 33/343* (2013.01); *G01R 33/345* (2013.01); *G01R 33/60* (2013.01); *H01P 7/10* (2013.01)

(58) Field of Classification Search
CPC .... G01R 33/60; H01P 7/10–105; H01P 7/105
(Continued)

(56) References Cited

U.S. PATENT DOCUMENTS 3,122,703 A    2/1964  Rempel
3,757,204 A    9/1973  Hyde
(Continued)

FOREIGN PATENT DOCUMENTS

CN    204 101 714    1/2015
JP     48 101 845    12/1973
(Continued)

OTHER PUBLICATIONS

"EPR Accessories—The solutions for Multiple-Choice EPR Experiments", Jul. 2011 (Jul. 2011), URL:https://www.bruker.com/fileadmin/user_upload/8-PDF-Docs/MagneticResonance/EPR_brochures//EPR_accessories.pdf [retrieved on Jul. 15, 2015].
(Continued)

*Primary Examiner* — Patrick Assouad
*Assistant Examiner* — Demetrius R Pretlow
(74) *Attorney, Agent, or Firm* — Paul Vincent (57) ABSTRACT

A microwave resonator for an EPR probe head has a metal cavity body (1) supporting an electromagnetic microwave resonance mode. The metal cavity body (1) has an opening for inserting a sample tube (2) to a center position of the resonator. The center of the opening and the center position of the resonator define an x-axis. The cavity body also has an opening for transmitting microwave radiation into the resonator. Two dielectric elements (4a, 4b) are located symmetrically to the E-field nodal plane containing the x-axis and a z-axis perpendicular to the x-axis. Each dielectric element is geometrically formed and positioned such that it provides an equal overlap with a local maximum of the microwave electric field energy. The microwave resonant cavity has a thin planar shape and the resonator is loaded with two dielectric elements, placed symmetrically relative to the central EPR sample.

13 Claims, 9 Drawing Sheets

(51) Int. Cl.
*G01R 33/345* (2006.01)
*G01R 33/60* (2006.01)

(58) Field of Classification Search
USPC .......................................................... 324/309
See application file for complete search history.

(56) References Cited

U.S. PATENT DOCUMENTS

| | | | |
|---|---|---|---|
| 3,931,569 A | | 1/1976 | Hyde |
| 4,633,180 A | | 12/1986 | Biehl |
| 5,345,203 A | | 9/1994 | Gentsch |
| 5,347,219 A | | 9/1994 | Gentsch |
| 5,598,097 A | | 1/1997 | Scholes |
| 5,714,920 A | * | 2/1998 | Ivanov ................... H01P 1/2084 333/219.1 |
| 6,496,089 B1 | * | 12/2002 | Åkesson ................... H01P 7/10 333/219.1 |
| 2011/0254642 A1 | * | 10/2011 | Enokida ................ C04B 35/462 333/219.1 |
| 2014/0021952 A1 | * | 1/2014 | Tkach ................... G01R 33/345 324/316 |
| 2016/0334476 A1 | * | 11/2016 | Doty .................... G01R 33/282 |

FOREIGN PATENT DOCUMENTS

| | | |
|---|---|---|
| JP | 48 101 854 | 5/1981 |
| JP | 2006-98188 | 4/2006 |

OTHER PUBLICATIONS

Wojciech, Piasecki et al. "A Rectangular Loop-Gap Resonator . . . ." JMR, 1998, vol. 134, pp. 36-43.

* cited by examiner

PRIOR ART

Fig. 8A

PRIOR ART

Fig. 8B

PRIOR ART

Fig. 8C

PRIOR ART

Fig. 8D

EPR MICROWAVE CAVITY FOR SMALL MAGNET AIRGAPS

This application claims Paris convention priority from EP 15 159 643.4, filed Mar. 18, 2015, the entire disclosure of which is hereby incorporated by reference.

BACKGROUND OF THE INVENTION

The present invention relates to a microwave resonator for an EPR (="electron paramagnetic resonance") probe head comprising: a metal cavity body supporting an electromagnetic microwave resonance mode, the microwave mode having an even number of local maxima of microwave electric field energy, at least one opening for inserting a sample tube to a center position of the resonator, the center of the opening and the center position of the resonator defining an x-axis, at least one opening for transmitting microwave radiation into the resonator, at least two identical dielectric elements located symmetrically to the plane known as "E-field nodal plane" which contains the x-axis and a z-axis perpendicular to the x-axis.

A device of this type is known from U.S. Pat. No. 3,757,204.

In the EPR method it is often desirable or even necessary to perform measurements at variable temperature conditions on a sample. The apparatus to irradiate an unknown paramagnetic sample with a microwave field is called EPR probe head. For easiness of achieving variable temperature conditions the probe head is usually placed inside of a cryostat which is coaxial to the EPR sample insertion mechanism. The cryostat itself is placed either between the poles of a split-coil magnet or inside the bore of a solenoid magnet.

For EPR experiments at X-band (8-12 GHz) or higher frequencies the size of magnet gap or solenoid bore becomes an important factor in the ownership cost of the EPR system. Such a size constraint also directly affects the design and performance of EPR probe heads. For example, at X-band or lower frequencies the standard air-filled EPR probe heads do not fit inside usual cryostats. It is necessary to use coaxial transmission lines instead of waveguides for microwave transmission while for the microwave resonator, as part of the probe head, this situation has been mitigated in so far by building loop-gap resonators (see e.g. DE 33 00 767 A1 for Split-Ring and BLGR solutions for Flex Line probe heads) or cylindrical shaped dielectric loaded resonant cavities (see e.g. DE 41 25 655 A1 or DE 41 25 653 A1 for Sapphire cylindrical TE011 mode solution for Flex Line probe heads).

In electron-nuclear dual spin resonance experiments, like ENDOR or EPR-DNP, it is often needed to simultaneously optimize the efficiency of microwave and RF field application over the sample volume. Fulfilling the constraint of optimal EPR and respectively NMR functionalities directly affects the design and performance of the apparatus.

Another application, the EPRI (EPR Imaging) method, requires the presence of a multiple sets of coils to create a magnetic gradient at the unknown sample inside the EPR microwave cavity. The fixture for these coils should be as mechanically decoupled as possible from the sensitive parts of EPR microwave cavity. This is highly difficult to accomplish due to space constraints if the cavity has circular symmetry.

It is particularly interesting to observe the influence of experimental conditions, in particular the temperature, on the microwave concept for EPR probe heads.

For high-sensitivity EPR applications at room temperature conditions the state-of-the-art EPR probe heads include flat shaped, air-filled microwave cavities (see e.g. DE 33 00 767 A1, DE 41 25 655 A1, DE 41 25 653 A1, U.S. Pat. No. 3,931,569-A for rectangular TE102, cylindrical TM110 and Reentrant mode probe heads).

For variable temperature experimental conditions, the state-of-the-art EPR probe heads are built around either via loop-gap or dielectric loaded resonating cavities, especially at L, S, C and X-bands in order to decrease the size of the resonating cavity.

The three versions of flat resonator geometries cited above traditionally used at room temperature are missing here. Instead one can find solutions based on dielectric loaded resonators or loop-gaps having circular symmetry along sample length direction. Indeed, such a choice for resonating mode symmetry is particularly suited to optimize the EPR side of the microwave problem, the filling factor parameter being considered in so far the most important. Attempts to use a coaxial stack of two or more dielectric elements for cavity loading have also been considered but proved to be more difficult than helpful. Even more, for an increasingly larger number of modern EPR applications, the microwave cavity geometries using a single element for dielectric loading also present serious challenges in obtaining a suitable trade-off between performance and usage stability.

It is an object of the invention to achieve performance and quality enhancements of EPR, EPR-ENDOR/DNP and EPRI variable temperature probe heads. This is realized by flat geometry resonators based on dielectric loaded microwave rectangular TE012 or cylindrical TM110 resonant modes with dielectric elements having a thickness comparable to the outer diameter of EPR sample tubes. A full disclosure of the conceptual design for this new microwave cavity for EPR purposes at variable temperature conditions or for narrow magnet gaps is the focus of the present invention.

U.S. Pat. No. 3,122,703 describes a cooled microwave resonator for EPR. A notched Dewar is used to cool an air-filled rectangular TE102 or cylindrical TM110 resonator.

Figure 8A:
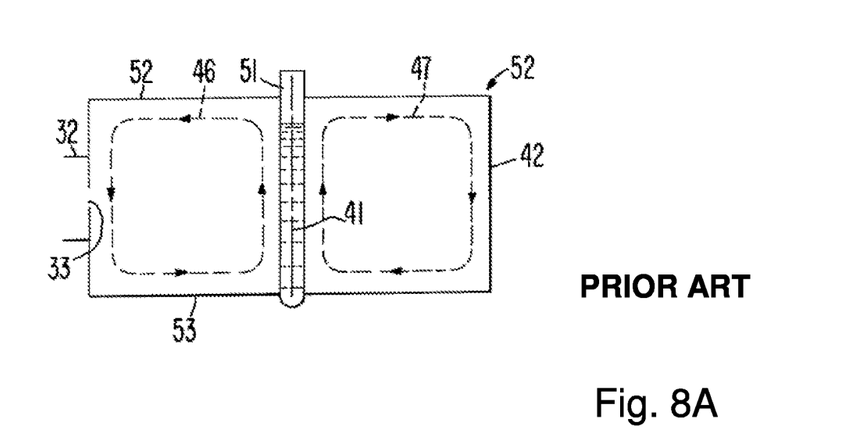
FIG. 8A-D is a selection of a relevant diagrams from prior art discussed earlier.
Figure 8B:
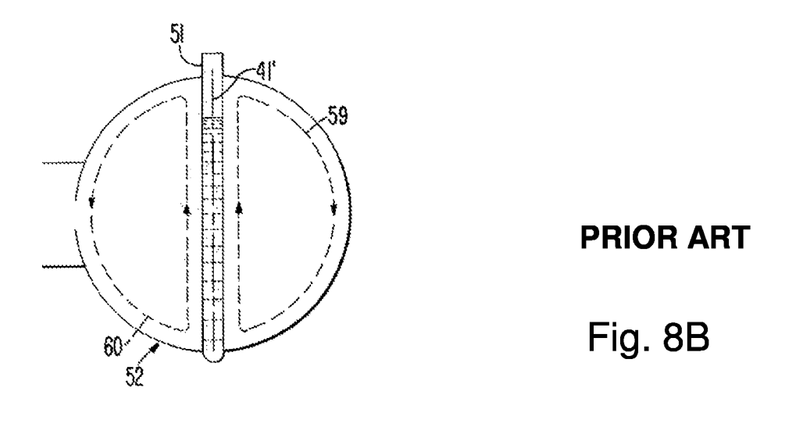

U.S. Pat. No. 3,931,569 shows in FIGS. 2 and 5 (see present FIGS. 8A and 8B, respectively) standard air-filled rectangular TE102 and cylindrical TM110 resonators for EPR.

Figure 8C:
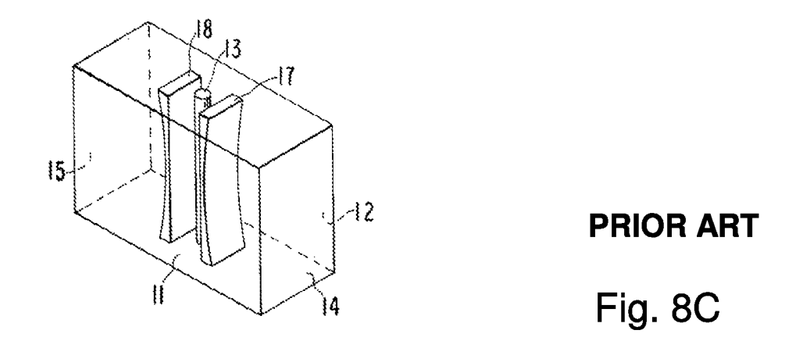

U.S. Pat. No. 3,757,204 describes different configurations of microwave resonators employing dielectric material for improving RF field uniformity along the sample. Especially FIG. 8C (taken from FIG. 4 of U.S. Pat. No. 3,757,204) depicts a microwave resonator with two dielectric plates extending to either side of the sample.

Figure 8D:
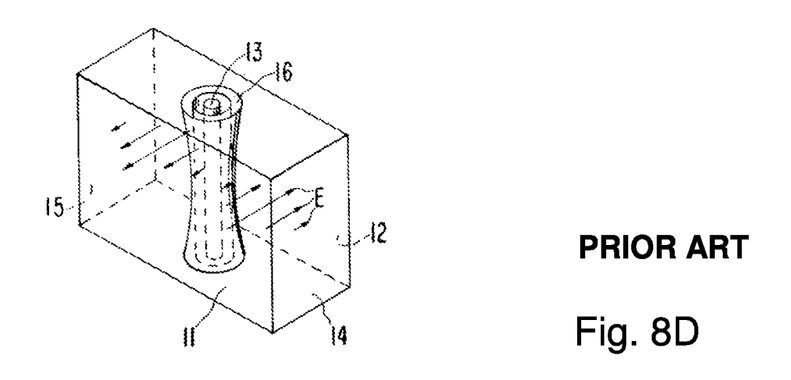

As the purpose of U.S. Pat. No. 3,757,204 is to homogenize the electromagnetic RF field in the sample, the dielectric plates are located close to the sample as shown in present FIG. 8C. As indicated in present FIG. 8D (taken from FIG. 1 of the document U.S. Pat. No. 3,757,204) the electric field E of the resonant mode has two maxima left and right to the center of the sample. To achieve its claimed functions, the dielectric plates in FIG. 8C must not extend into the regions with maximum of electric field but must increase their extensions in the peripheral regions having less electric field. As claimed, for such purposes a first requirement is an overall concave geometry for the inserts. Even more, a second implicit requirement is to maintain the homogenization of the RF field when a general sample with various dielectric properties is in the resonator. Whereas in the vertical direction the dielectric inserts have the same size as the sample and the resonator, along the shortest side of the resonator they are longer compared to the sample but shorter compared to the resonator length.

However, it is known that higher filling factors in EPR resonators require a trade-off in the Q-factor of the cavity, which linearly determines the EPR signal intensity from the sample. It is also known that limiting the sample volume requires a linear trade-off in the EPR signal intensity. These two trade-offs may cancel the advantages brought in by the claimed increase of the filling factor and a trade-off in the application range for this technical solution occurs. In yet another particular aspect, considering the class of high-sensitivity low-background EPR probe heads at X-band, usage of this approach in U.S. Pat. No. 3,757,204 does not provide sufficient reduction of resonator size to allow to be used in cryostats with standard 2" access bore, whereas any attempt to decrease the resonator size via dielectric loading using known low-background dielectrics will decrease or cancel the positive effect expected from the above claimed assumptions.

The present invention describes a way to substantially overcome one or more disadvantages and trade-offs of the above discussed existing methods.

One major object of the present invention is to propose a high sensitivity EPR resonator, with low background signals, that achieves a small size, compatible with narrow gap (<2 cm) magnets or cryostats.

Another object of the present invention is to propose an EPR resonator with high efficiency of static or low frequency field irradiation of an EPR sample.

SUMMARY OF THE INVENTION

According to the present invention, these objectives are achieved by modifying the device discussed above in that each dielectric element is geometrically formed and positioned such that it provides an equal overlap with a local maximum of the microwave electric field energy.

In the present invention the materials used for dielectric loading may exhibit low dielectric constant, for example Teflon, Rexolite and Quartz which are all of special interest for use in EPR because of their excellent microwave properties and lack of intrinsic EPR signals.

In another aspect the technical solution for obtaining an optimized geometry of EPR resonator, compatible with narrow gap magnets or cryostats, consists in a geometry that allows stacks of low frequency field coils (modulation, fast sweep, gradient or ENDOR) with planar geometries, protruding or not into the EPR resonator. The optimized geometry is considered to allow high efficiency of microwave and RF irradiation at the EPR sample, leading to high sensitivity EPR measurements, while minimizing the thermal, microwave and mechanical negative effects due to the increased proximity between these coil stacks and the EPR resonator.

In preferred embodiments of the present invention, each of the dielectric elements is elongated along an axis parallel to the x-axis. By this means the symmetry of the microwave mode is conserved and the filling factor is optimized.

In a further embodiment of the invention, the ratio of the thickness of the dielectric elements to the dimension of the opening for inserting the sample tube, both in direction of the z-axis of the resonator, is in the range 0.5 to 1.5. Within this range the filling factor can be optimized and the thickness of the resonator can be minimized.

In another embodiment of the invention, the overlapping is such that at least 50% of the microwave electric energy is confined within the dielectric elements. An overlap of at least 50% helps minimizing the size of the resonator and maintains the microwave mode after insertion of an arbitrary sample.

In still another embodiment of the invention, the resonator has a flat structure having a smallest internal extension along the z-axis equal to the thickness of the opening for inserting the sample tube or of the dielectric elements, whichever is greater. The flat structure allows placements of various field coils external to the resonator.

In a further embodiment of the invention, the dielectric elements are adjustable in a way to change the resonance frequency of the cavity body. The resonator can thereby be adapted to various experimental conditions.

In another class of embodiments of the invention, the microwave cavity of the resonator operates in dielectric loaded rectangular TE102 or cylindrical TM110 resonance modes and the dielectric elements are placed parallel to the x-axis centered to the points of microwave E-field maxima. Use of the specified modes allows a simple design of the resonator and the dielectric elements.

In a first variant of this class of embodiments, the resonator is of cylindrical shape. This shape is optimized for cylindrical resonator modes.

In a second variant of this class of embodiments, the resonator is box-shaped. This shape is optimized for rectangular resonator modes.

A further class of embodiments of the invention is characterized by at least one set of coils for creating a low frequency magnetic field traversing the cavity body and a sample tube, the coils being located at least partly inside the resonator and the connection to the outside of the cavity body being realized by openings in the side walls of the cavity body which are perpendicular to the z-axis. By this means the applied low frequency magnetic field is coupled very efficiently to the EPR sample as it is very close to the sample. In this aspect the turns of the coil are not fully contained in the resonator thereby minimizing their influence on the microwave mode in the resonator.

In a first variant of this class of embodiments, the windings of the coil are completely outside the cavity body. By this means the influence on the microwave mode in the resonator is eliminated.

In an alternative variant, the sections of the windings of the coil inside the cavity body have a general orientation parallel to the x-axis. By orientation parallel to the x-axis the influence in the microwave mode is minimized.

This class of embodiments can be further improved in that the resonator comprises metallized side plates having openings for providing access to field coils inside the resonator. Thereby the efficiency of the field coils is further optimized.

The present invention comprises also an EPR probe head with a microwave resonator as described above and a housing for holding the resonator located in a static magnetic field along the z-axis.

A preferred embodiment of such EPR probe head according to the present invention is characterized in that the probe head is placed inside a cryostat with the cavity body of the resonator being spaced from the innermost walls of the cryostat, and that the space between the cryostat and the resonator is equipped with modules containing stacks of low frequency planar coils for creating main magnetic field modulation and/or gradient fields and/or for fields for ENDOR or NMR excitation and detection.

These, as well as other objects and advantages of this invention, can be better understood and appreciated through careful study of the following detailed description of presently preferred exemplary embodiments of this invention in conjunction with the accompanying drawing.

In order to make the aforesaid and other features and advantages of the present invention more apparent to those skilled in the art, preferred embodiments of the present invention will be described in detail below by referring to the accompanying drawings, wherein identical numerals represent the same parts.

BRIEF DESCRIPTION OF THE DRAWING

FIG. 6-1 A-F illustrates the effect of increasing the dielectric loading (overlapping) in the regions of high E-field (energy) in six plots.

FIG. 6-2 A-F shows the percent amount of electric energy localized within the entire volume of the dielectric inserts versus the total electric energy of the mode enclosed in the cavity.

DESCRIPTION OF THE PREFERRED EMBODIMENT

Figure 1:
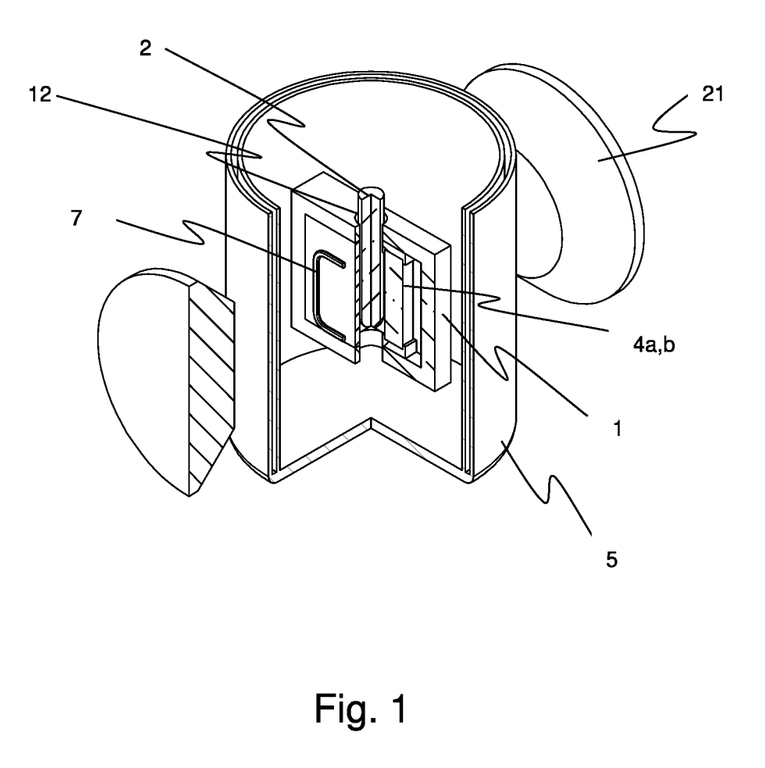
FIG. 1 shows a 3-dimensional sectional view of an embodiment of the invention.

A simplified example of the novel EPR experimental setup according to the present invention is shown in FIG. 1. The dielectric 4a,b loaded flat microwave cavity 1, is shown accompanied by a variable temperature cryostat 5, magnet poles 21 of an external magnet creating a main static magnetic field and a modulation coil 7 responsible for creating the modulation magnetic field traversing the EPR cavity and the paramagnetic sample 2 in an EPR experiment. The sample mostly consists of a tube holding a substance to be measured. When describing features of the resonator related to the position of the sample it is understood this equivalent to the space provided for accommodation of the sample. For clarity all other details concerning mechanical or microwave standard implementations were suppressed (various supports, coaxial microwave transmission line and microwave coupling structure necessary to excite the microwave resonance which is relevant for EPR use).

It is an object of this invention to disclose a microwave resonant cavity of thin planar shape for an EPR probe head. The resonator is loaded with two dielectric elements, of identical shape and physical properties, placed symmetrically relative to the central EPR sample. When included in a probe head the resonator is also contained by the mirror symmetry plane between the main magnet poles.

Figure 2:
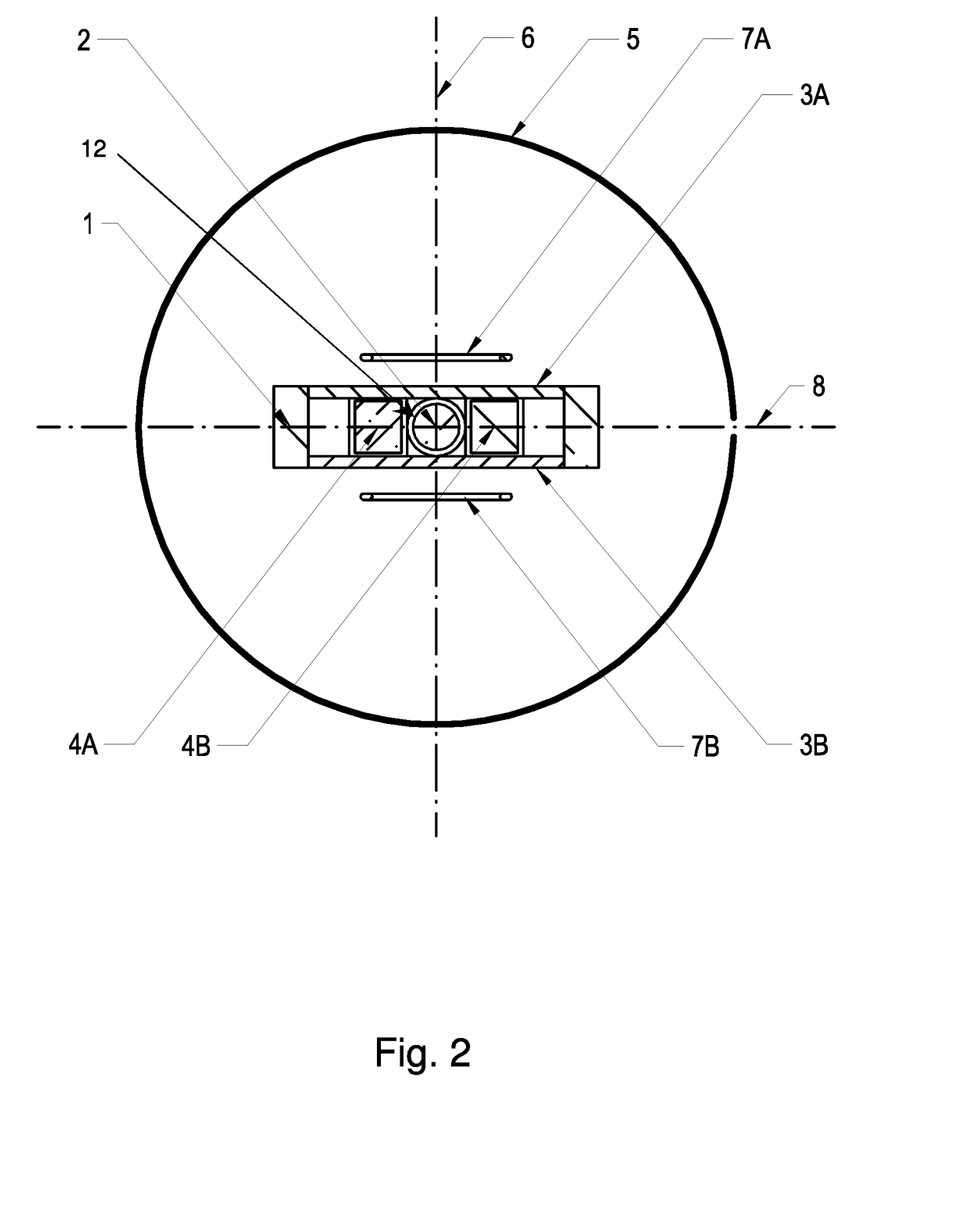
FIG. 2 shows a schematic cross-sectional view through a horizontal middle plane of an EPR probe head comprising a microwave resonator according to the invention being located inside a cryostat.

FIG. 2 represents this construction by a cross section in transversal plane relative to the EPR sample access axis. The height of cut plane is set through the middle of EPR active region.

The EPR microwave cavity is composed of a metal cavity body 1 and two lateral side plates 3A and 3B. These three elements are electrically connected continuously throughout their line of contact to eliminate the leakage of microwave field. The cavity body 1 has other openings such as the access bores 12 for the EPR sample 2 and the access bore 13 for a standard microwave coupling structure via iris aperture or coaxial antenna feed (not shown in this drawing).

Magnet poles (not shown in this drawing) create the uniform static magnetic field oriented along an axis, which normally coincides with the z-axis (6) of the resonator. The unknown paramagnetic sample 2 to be measured by EPR method is contained in a cylindrical fused quartz tube and oriented perpendicular to axes 6 and 8, the latter (8) defining a y-axis being usually called the front-back axis of the magnet. The center of the opening 12 for inserting a sample and the center position of the resonator defines an x-axis (11). The electric field has a nodal plane ("E-Field nodal plane") which contains the x-axis and a z-axis perpendicular to the x-axis. In the nodal plane the E field amplitude disappears.

According to the present invention, the EPR microwave cavity contains two identical dielectric inserts 4A and 4B placed symmetrically to the working position of an EPR sample 2, their position on axis 8 being approximately the location of maximum microwave electric field component along axis 6 and therefore the local maximum of the electric field energy. Their exact position is determined by the microwave mode used and by the details of EPR cavity 1 inclusive by shape and dielectric properties of the inserts 4A and 4B and the EPR sample 2 and may be adjustable for resonance frequency tuning reasons. The details of the shape for dielectric inserts 4A and 4B will be discussed later below.

The side plates 3A and 3B, which are perpendicular to axis 6, are realized using standard microwave materials and structures for EPR applications to allow low frequency magnetic fields (from DC to some MHz) to penetrate the entire cavity and the unknown EPR sample 2. For example, the modulation field could be created outside the resonator by modulation coils 7A and 7B. The metallic side plates 3A and 3B are sufficiently thin and could be locally opened, avoiding leakage of high frequency microwave, but increasing the penetration of low frequency fields created by respective coils placed externally to this cavity along axis 6 and symmetrically with respect to axis 8. Alternatively, such local openings of side plates can be used for the insertion of low frequency field coils (ex. Fast-Sweep or ENDOR coils) inside the EPR cavity (see FIG. 7). In both cases however the condition for low microwave leakage must be fulfilled. It is new to CW-EPR to provide access for field coils from the side plates.

FIG. 2 reflects several critical aspects pertinent to the present invention regarding the size of the claimed EPR cavity and its placement inside the variable temperature cryostat 5.

Firstly, it is easily observed that the available space to accommodate low frequency planar coils is sufficient, i.e.

space between the cavity side plates 3A and 3B and the geometrical limits imposed by cryostat 5, has been increased dramatically in comparison to current state-of-the-art solutions for EPR cavities of circular symmetry.

A second important aspect is the possibility to place the low frequency coils to the minimal possible distance to sample 2, defined only by its outer diameter and not by the volume of EPR cavity.

A third advantage of the claimed EPR cavity refers to the shape and construction of dielectric inserts 4A and 4B. Their geometry can be adapted, from case to case, in order to obtain the desired shape of the microwave magnetic field distribution across the sample, according to the sample geometry and properties, according to the desired functionality of the microwave cavity parameters (for example cavity shape and volume, resonant frequency on the desired mode of operation, quality and filling factors) or presence of other various metallic or dielectric inserts in the cavity (for example a pair of Endor coils).

Figure 5:
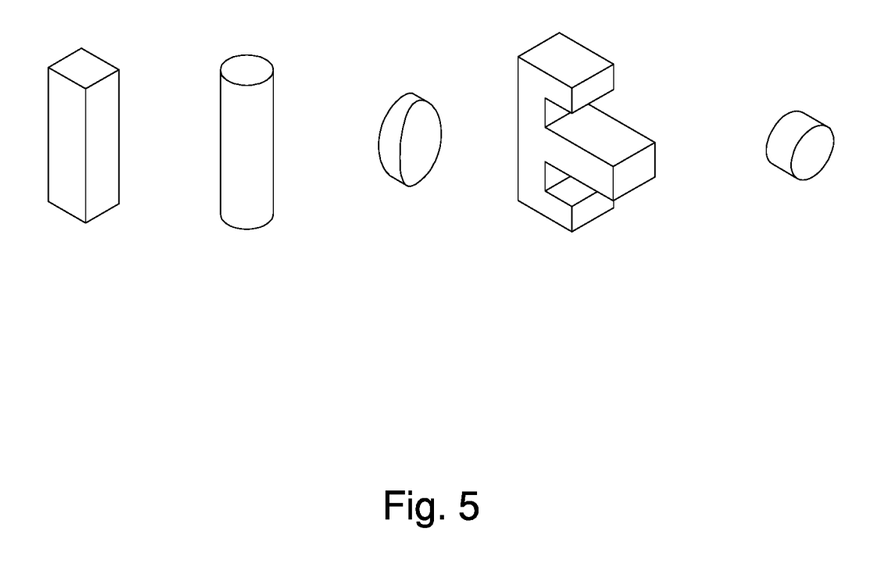
FIG. 5 shows several schematic 3-dimensional views of some possible shapes of dielectric elements used in embodiments of the EPR resonator according to the invention.

This conceptual flexibility to match the microwave cavity to a given EPR application represents a major advantage of this present invention. FIG. 5 shows a variety of other geometries of dielectric inserts that may be used in the claimed EPR cavity for optimization to the given applications like CW, Pulsed, EPR-Imaging.

The resonance frequency for either rectangular TE102 or cylindrical TM110 mode without dielectric loading is mostly independent of the cavity thickness along the z-axis. In the case of dielectric loading for the same two resonant modes the result is largely different. Different values for the ratio between thicknesses of the dielectric elements and of the cavity will affect the TE102 and TM110 modes resonance frequency.

The use of higher permittivity dielectric materials for 4A and 4B will enhance the change of resonance frequency with the thickness ratio. It is advantageous that the thickness of dielectric elements 4A and 4B along the z-axis varies in a range from 0.5× to 1.5× relative to the opening 12 for inserting a sample tube 2 in order to obtain optimal solutions for a large range of EPR applications (e.g. high sensitivity, Pulsed EPR, etc.; general aspects can be found in "Electron Spin Resonance" by Charles P. Poole 1997, 978-0-486-69444-3 (ISBN)). If the relative size of the dielectric elements is not in the optimum range the quality of the system decreases (e.g. sensitivity, B1).

Also, according to present invention, the total thickness of the cavity along the z-axis should be nearly equal to the thickness of the dielectric elements 4A and 4B, or to the opening 12 for inserting a sample tube 2, whichever is greater.

Figure 3A:
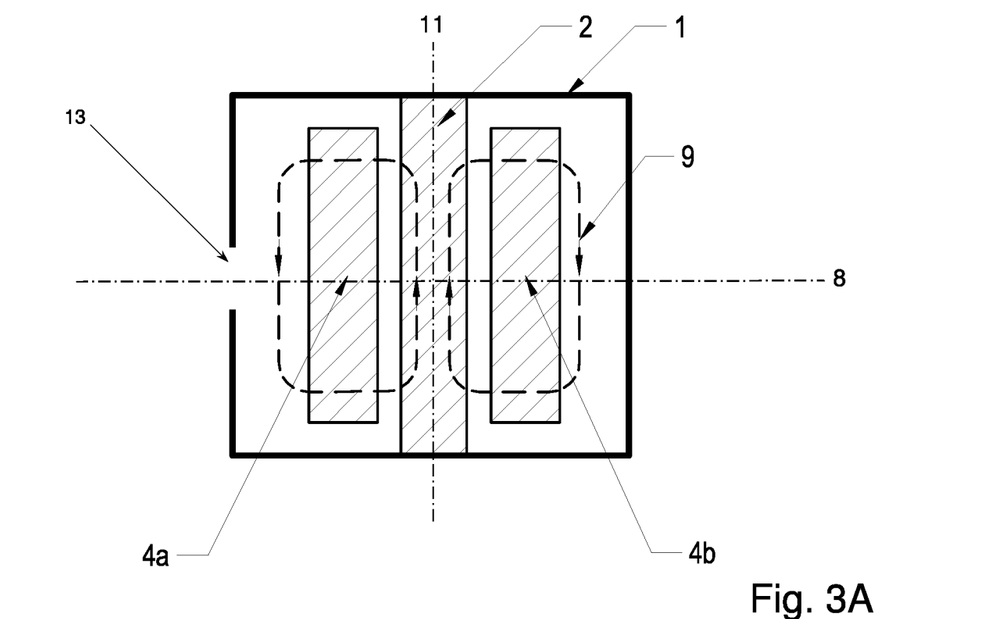
FIG. 3A shows a schematic cross-sectional view through a vertical middle plane of a first embodiment of the EPR microwave resonator according to the invention applied to a rectangular TE102 resonance mode.
Figure 3B:
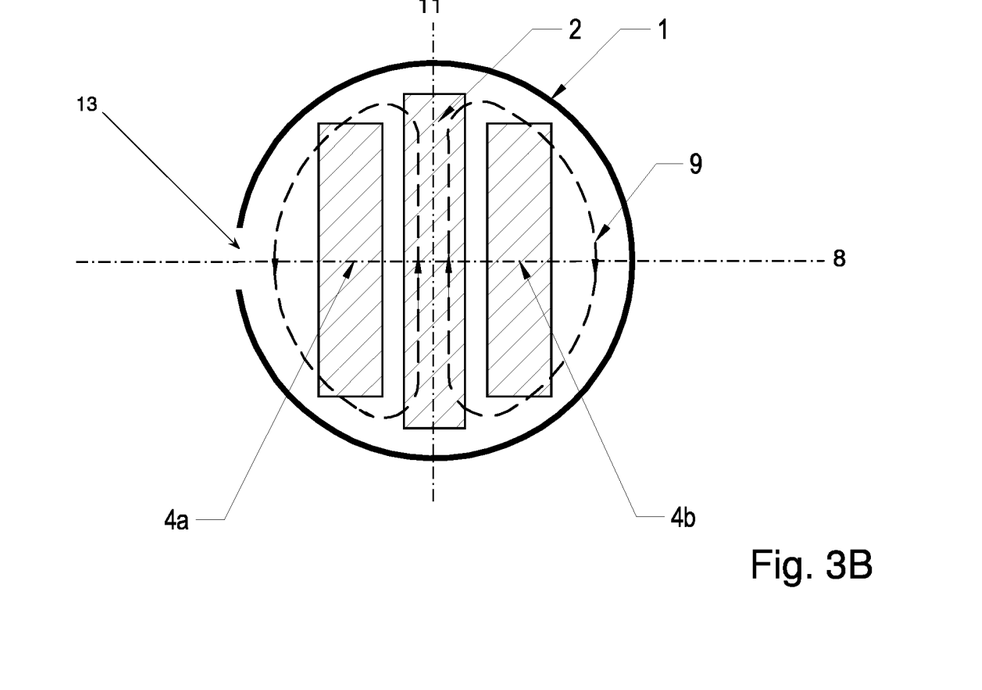
FIG. 3B shows a schematic cross-sectional view through a vertical middle plane of second embodiment of the EPR microwave resonator according to the invention applied to a cylindrical TM110 mode.

FIG. 3A and FIG. 3B show the microwave relevant elements of the two preferred embodiments of this invention, depicting a rectangular TE102 mode and a cylindrical TM110 mode.

The two figures show the H-field (flux lines) patterns 9 in a plane defined by the plane of y-axis 8 and the x-axis 11. In both figures all elements are labeled identically, having the same functionalities, while keeping also the same meanings as in FIG. 2. Since only the magnetic field lines penetrating the sample are affecting a resonance absorption signal from the paramagnetic spins in the sample, the presence of electrical field at the sample should be normally avoided. The EPR resonators and their choice of resonant mode fulfill this condition, and the regions of strong electric field are placed away from the sample by means of suitable choice of the dielectric elements shape and position. For rectangular TE102 and cylindrical TM110 modes the local maxima of the E-field (including the effect of dielectric loading) are located approximately in the middle between sample center and respective walls of the resonator along axis 8.

Figure 4A:
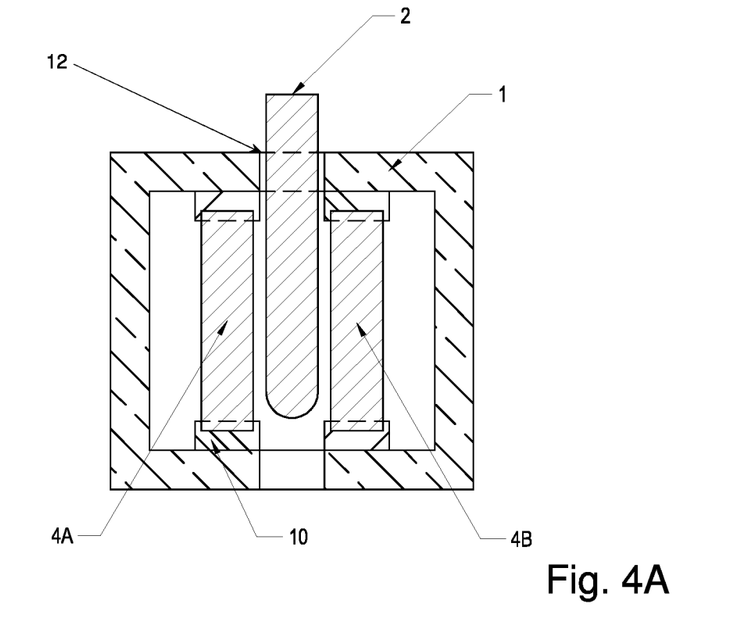
FIG. 4A shows the embodiment of FIG. 3A in greater detail.
Figure 4B:
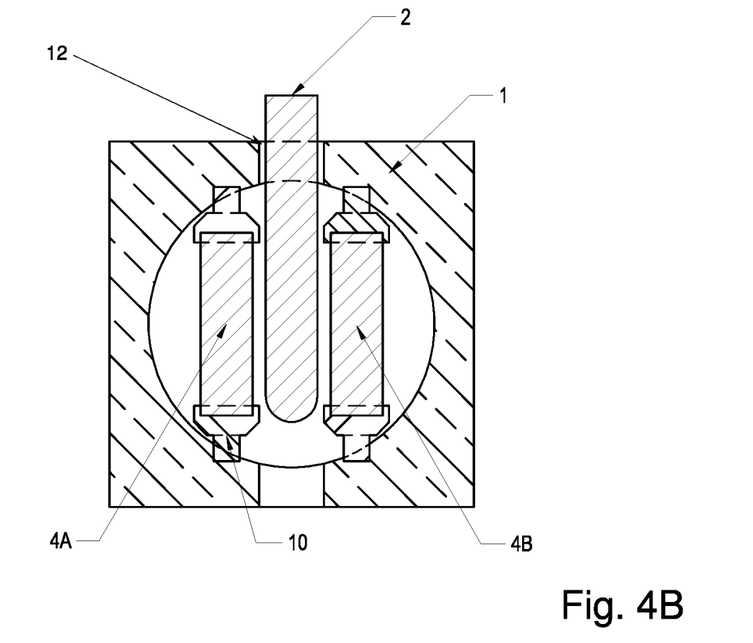
FIG. 4B shows the embodiment of FIG. 3B in greater detail.

In FIG. 4A and FIG. 4B, the same cross section plane as in FIG. 3A and FIG. 3B, respectively, is used to show in more detail the construction elements, including dielectric inserts supports 10.

The supports 10 are adapted to the longitudinal and transversal geometry of the dielectric inserts 4A and 4B as well as to the cavity body 1 and to side plates 3A and 3B. Therefore, since all these are variables in both microwave concept and technological implementation, the use of rectangular shapes must not be considered as limiting within the meaning of the present invention.

Figure 61:
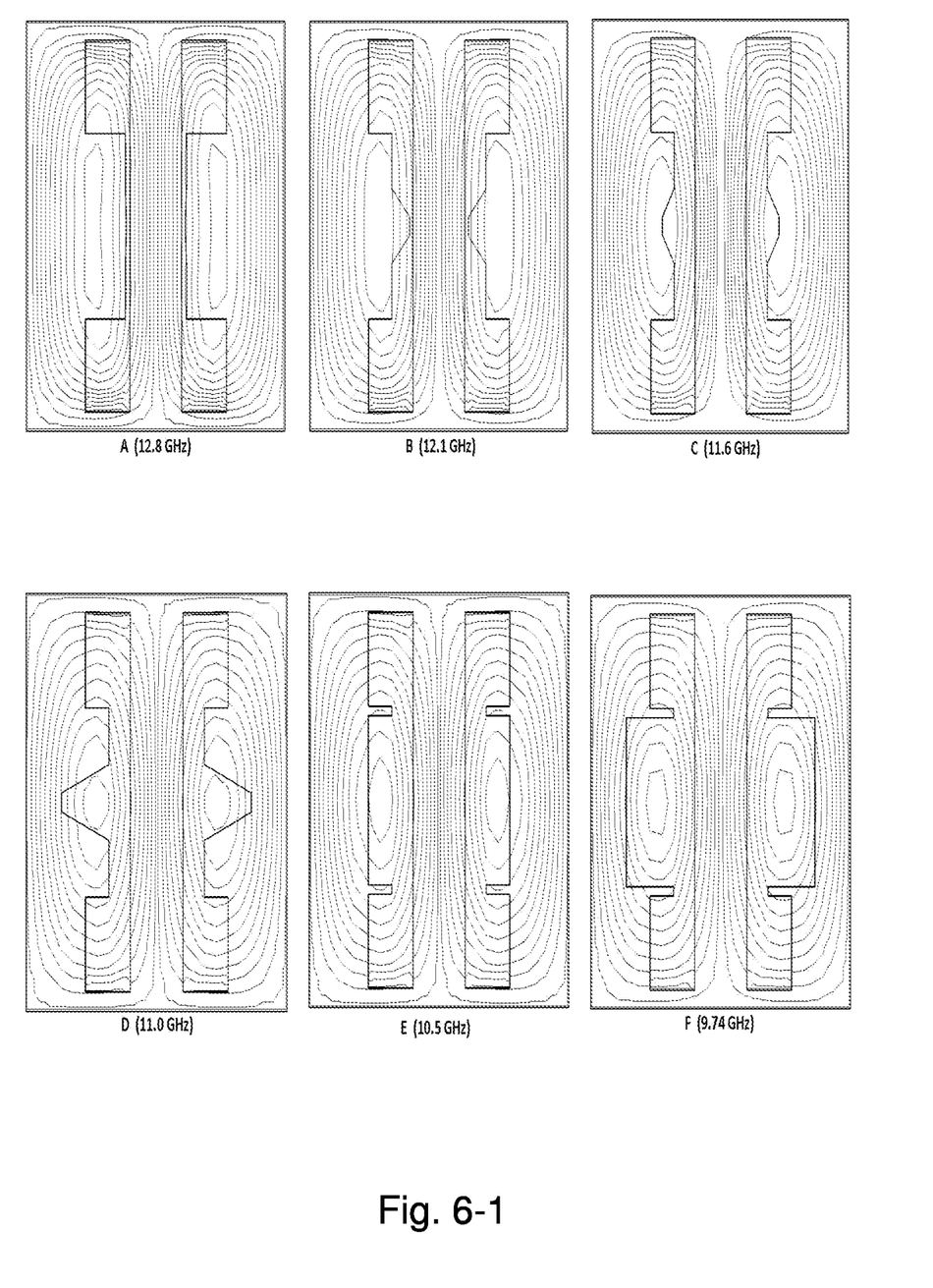

The same non-limiting considerations must be acknowledged for the assumed rectangular geometry for the dielectric inserts, this choice being only relevant for the description of the preferred embodiment of the present invention. In a real apparatus their transversal cross section could be square, rectangular, cylindrical, tubular, ellipsoidal or even a combination of these (see several options in FIG. 5), as well as it should be clear that the cross-sections of elements 4A and 4B must not be constant along their length in order to work for an apparatus described in this disclosure. The dielectric elements 4A and 4B should only be required to have a central region that protrudes significantly into the high E-field microwave regions, as exemplified in the plots of FIG. 6-1D-F such that preferably more than 50% of electric field energy is confined in the central region of these elements.

FIG. 6-1 shows the effect of increasing the dielectric loading (overlapping) in the regions of high E-field. The figures show the periphery of a rectangular resonator containing two dielectric elements (depicted transparent for clarity) shaped differently in the respective plots. Lines indicate the iso-lines of equal electric field strength of a rectangular TE102 mode with lowest values at the walls of the resonator. At the same time the E field iso-lines represent the B1 field lines of the microwave. As the electric field energy is proportional to the square of the electric field these diagrams describe the change of electric field energy as well.

In the first 3 plots FIG. 6-1 A-C (12.8 GHz, 12.1 GHz and 11.6 GHz) the effect induced by "concave dielectric elements" similar to Hyde U.S. Pat. No. 3,757,204 is shown. The E-field distribution is seen to be more elongated in the direction parallel to sample 2, improving the spatial homogeneity of the B1-field, as required in Hyde U.S. Pat. No. 3,757,204.

Figure 62:
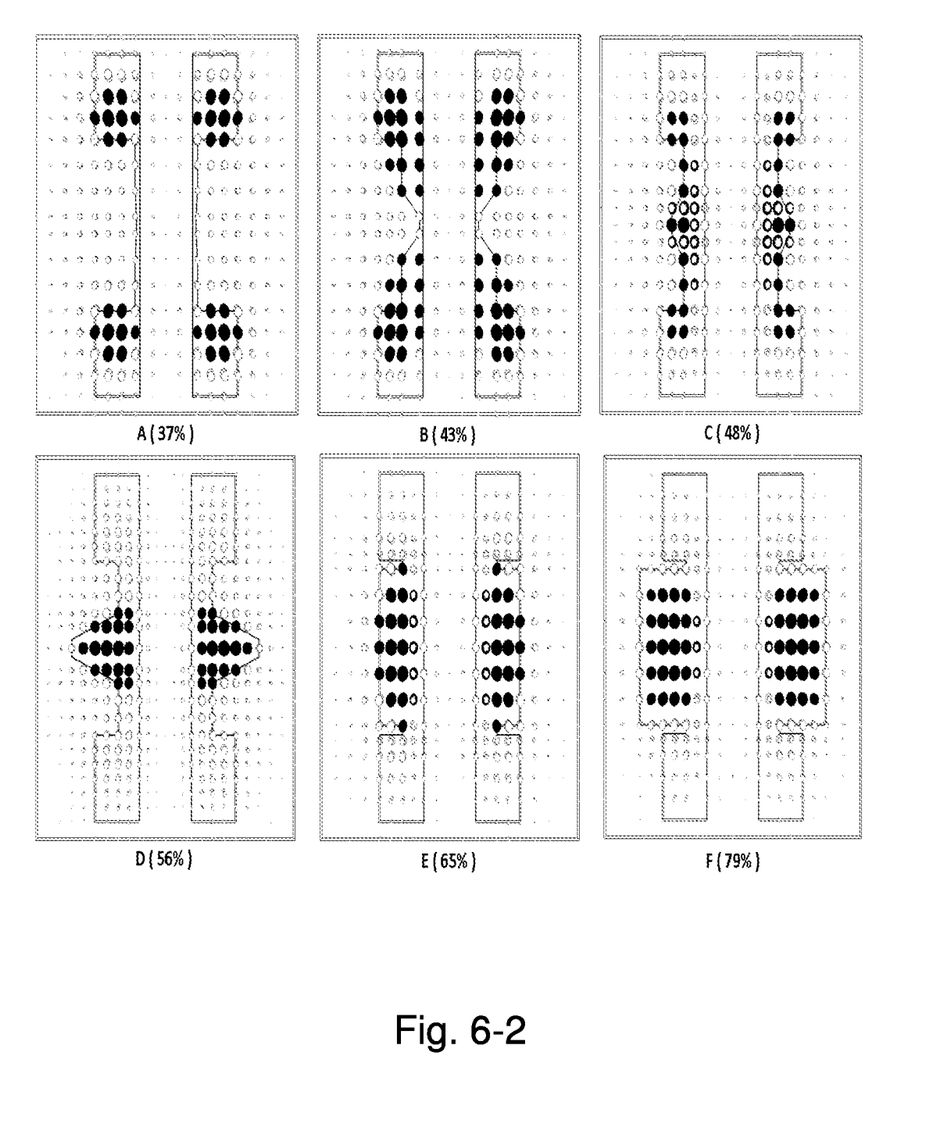

In the last 3 plots FIG. 6-1 D-F (11.0 GHz, 10.5 GHz and 9.74 GHz) the two dielectric elements overlap the regions of E-field maximum resulting in a "focused" distribution of electrical energy inside the resonator. As can be seen the homogeneity of the B1 field at sample region between the dielectric elements has decreased. Furthermore, increased dimension of the dielectric elements, i.e. increased dielectric loading, results in a slight decrease of the frequency of resonance. According to the invention an overlap of the central dielectric regions with the positions of maximum E-field, will not cease to function if the electrical energy included in these regions are above 50% of the entire microwave energy in the cavity, therefore sustaining the same resonance modes for any choice of shape and dielectric strength. This is shown in FIG. 6-2.

FIG. 6-2 A-F shows the percent amount of electric energy localized within the entire volume of the dielectric inserts versus the total electric energy of the mode enclosed in the cavity for the same configurations as in FIG. 6-1 A-F. To enhance the visualization of the effect in the previous paragraph, these plots represent the distribution of electrical "energy density" in the x-y-plane. The size of circles represents the amount of this "energy density". The filled/open display of circles represents the values of "energy density" of those circles which passed/missed 50% of the full range of "energy density".

Figure 7:
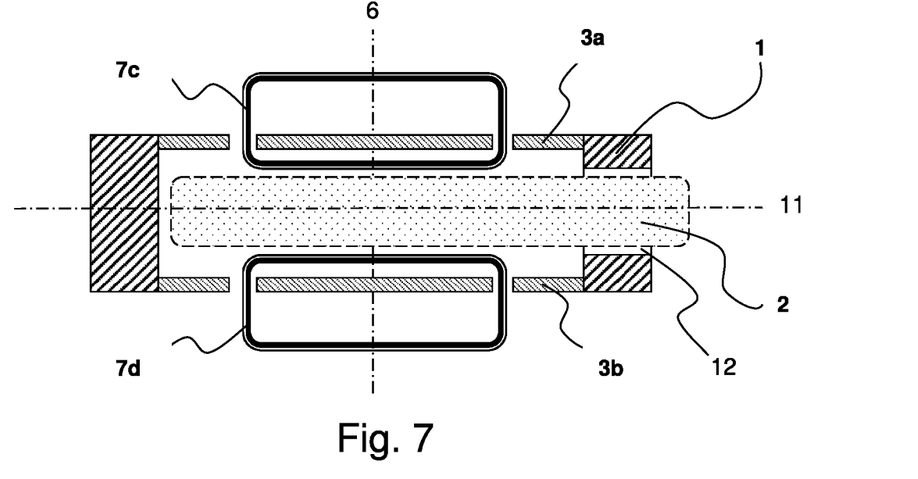
FIG. 7 shows a schematic representation for the embodiment of the field coils partially protruding into the EPR resonator from the side plates parallel to a sample.

FIG. 7 shows the microwave resonator 1 in a cut parallel to a plane defined by the x-axis (11) and the z-axis (6). The sample tube 2 is inserted into the resonator and extends to the left side of the figure. Side plates 3a and 3b cover the sides of the resonator. Coils (7c, 7d) used for creating a low frequency magnetic field are traversing the cavity body through holes in the side plates (3a, 3b). The windings of the coils are located at least partially inside the resonator. Sections of windings in the resonator have a general orientation along the x-axis (11).

For clear definition of parameters, the thickness T of the resonator shall be the distance between the two parallel planes bounding the cavity which are perpendicular to the E field nodal plane and parallel to the x-axis. The height H of the resonator is considered to be measured along the x-axis and the width W is the maximal distance between the cavity walls along the direction perpendicular to the x-axis and the z-axis.

Preferred dimensions of the microwave resonator at X-band (8-12 GHz) are W×H×T 22 mm×(20+/−2) mm×5 mm.

Preferably the dielectric elements are made of Quartz and have rectangular dimensions of e.g. W×H×T 4.5 mm× (17+/−2) mm×4.5 mm. Separation of the dielectric elements (center to center) is 11 mm.

While only certain features of the invention have been illustrated and described herein, many modifications and changes will occur to those skilled in the art. It is, therefore, to be understood that the appended claims are intended to cover all such modifications and changes as fall within the true spirit of the invention.

We claim:

1. A microwave resonator, the resonator comprising:
a metal cavity body structured for supporting an electromagnetic microwave resonance mode, said microwave resonance mode having an even number of local maxima of microwave electric field energy, said metal cavity body having at least one first opening for inserting a sample tube to a center position of the resonator, wherein a center of said first opening and a center position of the resonator define an x-axis, said metal cavity body also having at least one second opening for transmitting microwave radiation into the resonator; and
at least two substantially identical dielectric elements disposed symmetrically with respect to an E-field nodal plane, said E-field nodal plane containing said x-axis and a z-axis which is perpendicular to said x-axis, wherein each dielectric element is geometrically formed and positioned to provide an equal overlap with a local maximum of said microwave electric field energy, wherein the resonator has a flat structure having a smallest internal extension along said z-axis substantially equal to a thickness of said first opening or of said dielectric elements, whichever is greater.

2. The resonator of claim 1, wherein each of said dielectric elements is elongated along an axis parallel to said x-axis.

3. The resonator of claim 1, wherein a ratio of a thickness of said dielectric elements to a dimension of said first opening, both in a direction of said z-axis of the resonator, is in a range of 0.5 to 1.5.

4. The resonator of claim 1, wherein said equal overlap is such that at least 50% of said microwave electric field energy is within said dielectric elements.

5. The resonator of claim 1, wherein said dielectric elements change a resonance frequency of said cavity body.

6. The resonator of claim 1, wherein the resonator is of cylindrical shape.

7. The resonator of claim 1, wherein the resonator is box-shaped.

8. A microwave resonator, the resonator comprising:
a metal cavity body structured for supporting an electromagnetic microwave resonance mode, said microwave resonance mode having an even number of local maxima of microwave electric field energy, said metal cavity body having at least one first opening for inserting a sample tube to a center position of the resonator, wherein a center of said first opening and a center position of the resonator define an x-axis, said metal cavity body also having at least one second opening for transmitting microwave radiation into the resonator; and
at least two substantially identical dielectric elements disposed symmetrically with respect to an E-field nodal plane, said E-field nodal plane containing said x-axis and a z-axis which is perpendicular to said x-axis, wherein each dielectric element is geometrically formed and positioned to provide an equal overlap with a local maximum of said microwave electric field energy, and further comprising at least one set of coils for creating a low frequency magnetic field traversing said cavity body and the sample tube, said coils being located at least partly inside the resonator, said coils having a connection to an outside of the cavity body via openings in the side walls of said cavity body which are perpendicular to said z-axis.

9. The resonator of claim 8, wherein windings of said coils are completely outside said cavity body.

10. The resonator of claim 8, wherein a section of windings of said coils inside said cavity body has a general orientation parallel to said x-axis.

11. The resonator of claim 8, wherein the resonator comprises metallized side plates having openings for providing access to said coils inside the resonator.

12. The resonator of claim 1, wherein said cavity body of the resonator operates in dielectric loaded rectangular TE102 or cylindrical TM110 resonance modes, and said dielectric elements are placed parallel to said x-axis centered to points of microwave E-field maxima.

13. An EPR (electron paramagnetic resonance) probe head, the probe head comprising:
a microwave resonator, wherein said resonator comprises a metal cavity body structured for supporting an electromagnetic microwave resonance mode, said microwave resonance mode having an even number of local maxima of microwave electric field energy, said metal cavity body having at least one first opening for inserting a sample tube to a center position of the resonator, wherein a center of said first opening and a center position of the resonator define an x-axis, said metal cavity body also having at least one second opening for transmitting microwave radiation into the resonator, said resonator also having at least two substantially identical dielectric elements disposed symmetrically with respect to an E-field nodal plane, said E-field nodal plane containing said x-axis and a z-axis which is perpendicular to said x-axis, wherein each dielectric element is geometrically formed and positioned to provide an equal overlap with a local maximum of said microwave electric field energy;

a housing for holding said microwave resonator in a static magnetic field along a z-axis; and a cryostat within which said probe head is placed, wherein said cavity body of the resonator is spaced from innermost walls of said cryostat, and a space between said cryostat and the resonator is equipped with modules containing stacks of low frequency planar coils for creating main magnetic field modulation, gradient fields, and/or for fields for ENDOR or NMR excitation and detection.

\* \* \* \* \*